(12) United States Patent
Lin

(10) Patent No.: US 9,503,078 B1
(45) Date of Patent: Nov. 22, 2016

(54) METHOD AND APPARATUS FOR CHARGE TRANSFER

(71) Applicant: Realtek Semiconductor Corp., Hsinchu (TW)

(72) Inventor: Chia-Liang (Leon) Lin, Fremont, CA (US)

(73) Assignee: REALTEK SEMICONDUCTOR CORP., Hsinchu (TW)

(*) Notice: Subject to any disclaimer, the term of this patent is extended or adjusted under 35 U.S.C. 154(b) by 0 days.

(21) Appl. No.: 14/719,408

(22) Filed: May 22, 2015

(51) Int. Cl.
*H03K 3/00* (2006.01)
*H03K 17/687* (2006.01)

(52) U.S. Cl.
CPC .................. *H03K 17/687* (2013.01)

(58) Field of Classification Search
USPC ......................................... 327/109
See application file for complete search history.

(56) References Cited

U.S. PATENT DOCUMENTS

| 8,385,498 | B2 | 2/2013 | Anthony | |
|---|---|---|---|---|
| 2009/0237068 | A1* | 9/2009 | Vora | G01R 21/10 324/76.11 |
| 2010/0026542 | A1* | 2/2010 | Wang | H03F 1/303 341/155 |
| 2012/0275251 | A1* | 11/2012 | Jin | G11C 7/065 365/203 |

OTHER PUBLICATIONS

TW Office Action dated Aug. 29, 2016 in Taiwan application (No. 105105085).
Search Report issued in TW Office Action dated Aug. 29, 2016 in Taiwan application (No. 105105085).

* cited by examiner

*Primary Examiner* — Lincoln Donovan
*Assistant Examiner* — Patrick Chen
(74) *Attorney, Agent, or Firm* — McClure, Qualey & Rodack, LLP

(57) ABSTRACT

A circuit comprises: a first capacitor; a second capacitor; a MOS (metal oxide semiconductor) transistor; and an operational amplifier, wherein the first capacitor is configured to couple to the second capacitor via the MOS transistor; the operational amplifier is configured to receive a voltage at the first capacitor and output a control voltage; and the MOS transistor is configured to be controlled by the control voltage.

11 Claims, 4 Drawing Sheets

METHOD AND APPARATUS FOR CHARGE TRANSFER

BACKGROUND OF THE INVENTION

Field of the Invention

The present invention generally relates to charge transfer.

Description of Related Art

Persons of ordinary skill in the art understand terms and basic concepts related to microelectronics that are used in this disclosure, such as "voltage," "signal," "logical signal," "clock," "phase," "capacitor," "charge," "current," "transistor," "MOS (metal-oxide semiconductor)," "PMOS (p-channel metal oxide semiconductor)," "NMOS (n-channel metal oxide semiconductor)," "source," "gate," "drain," "threshold voltage," "circuit node," "ground node," "operational amplifier," "virtual ground," "electrical potential," "switch," "open circuit," "short circuit" "single-ended circuit," and "differential circuit." Terms and basic concepts like these are apparent to those of ordinary skill in the art and thus will not be explained in detail here.

Through this disclosure, a logical signal is a signal of two states: "high" and "low," which can also be re-phrased as "1" and "0." For brevity, a logical signal in the "high" ("low") state is simply stated as the logical signal is "high" ("low"), or alternatively, the logical signal is "1" ("0"). Also, for brevity, quotation marks may be omitted and the immediately above is simply stated as the logical signal is high (low), or alternatively, the logical signal is 1 (0), with the understanding that the statement is made in the context of describing a state of the logical signal.

A logical signal is said to be asserted when it is high. A logical signal is said to be de-asserted when it is low.

A clock signal is a cyclic logical signal. For brevity, hereafter, "clock signal" may be simply referred to as "clock."

FIG. 1 shows a schematic diagram of a prior art charge transfer circuit 100, which comprises: a first capacitor $C_I$, a second capacitor $C_F$, and an operational amplifier 110. The operational amplifier 110 imposes a virtual ground condition on a circuit node 101, thus causing a charge stored on the first capacitor $C_I$ to transfer to the second capacitor $C_F$. The principle of the prior art charge transfer circuit 100 is well known to those of ordinary skill in the art and thus not explained in detail here. An issue with the prior art charge transfer circuit 100 is: the operational amplifier 110 needs to provide an output current $I_O$ injected to the circuit node 101 via the second capacitor $C_F$ to impose the virtual ground condition on the circuit node 101 and thus fulfill the charge transfer. To enable a fast charge transfer, the operational amplifier 110 should have a high driving capability, which enables a large output current $I_O$. An operational amplifier of a high driving capability is power hungry. Therefore, the prior art charge transfer circuit 100 is power hungry if a fast charge transfer is sought.

What is desired is a charge transfer circuit that is more power efficient.

BRIEF SUMMARY OF THE INVENTION

Certain embodiments of the present invention involve a transfer of charge stored on a first capacitor to a second capacitor via a MOS (metal oxide semiconductor) transistor, wherein a voltage of a gate terminal of the MOS transistor is controlled by an amplification of a voltage of the first capacitor.

In an embodiment, a circuit comprises: a first capacitor; a second capacitor; a MOS (metal oxide semiconductor) transistor; and an operational amplifier, wherein: the first capacitor is configured to couple to the second capacitor via the MOS transistor; the operational amplifier is configured to receive a voltage at the first capacitor and output a control voltage; and the MOS transistor is configured to be controlled by the control voltage. In an embodiment, the MOS transistor is a PMOS transistor (p-channel metal oxide semiconductor). In another embodiment, the MOS transistor is a NMOS transistor (n-channel metal oxide semiconductor).

In an embodiment, a circuit comprises: a first capacitor; a second capacitor; a MOS (metal oxide semiconductor) transistor; an operational amplifier; a first switch controlled by a first clock signal; a second switch controlled by a second clock signal; and a third switch controlled by a third clock signal, wherein: the first capacitor is configured to receive a charge via the first switch when the first clock signal is asserted, the second capacitor is configured to be reset via the second switch when the second clock signal is asserted, the first capacitor is configured to couple to the second capacitor via the MOS transistor and the third switch when the third clock signal is asserted, the operational amplifier is configured to receive a voltage at the first capacitor and output a control voltage, and the MOS transistor is configured to be controlled by the control voltage. In an embodiment, the MOS transistor is a PMOS transistor (p-channel metal oxide semiconductor). In another embodiment, the MOS transistor is a NMOS transistor (n-channel metal oxide semiconductor). In an embodiment, the first clock signal and the third clock signal are non-overlapping, and also the second clock signal and the third clock signal are non-overlapping.

In an embodiment, a method comprises: storing a voltage at a first capacitor; resetting a voltage at a second capacitor; coupling the first capacitor to the second capacitor via a MOS transistor; generating a control voltage by amplifying a voltage of the first capacitor; and controlling a gate terminal of the MOS (metal oxide semiconductor) transistor using the control voltage. In an embodiment, the MOS transistor is a PMOS transistor (p-channel metal oxide semiconductor). In another embodiment, the MOS transistor is a NMOS transistor (n-channel metal oxide semiconductor). In an embodiment, the storing comprises coupling the first capacitor to an input voltage via a switch controlled by a clock signal that is asserted during the storing. In an embodiment, the resetting comprises coupling the second capacitor to ground node via a switch controlled by a clock signal that is asserted during the resetting. In an embodiment, the coupling comprises coupling the first capacitor to the second capacitor via a serial connection of the MOS transistor and a switch controlled by a clock signal that is asserted during the coupling. In an embodiment, the generating comprises using an operational amplifier.

DETAILED DESCRIPTION OF THE INVENTION

The present invention relates to charge transfer. While the specification describes several example embodiments of the invention considered favorable modes of practicing the invention, it should be understood that the invention can be implemented in many ways and is not limited to the particular examples described below or to the particular manner in which any features of such examples are implemented. In other instances, well-known details are not shown or described to avoid obscuring aspects of the invention.

Figure 1:
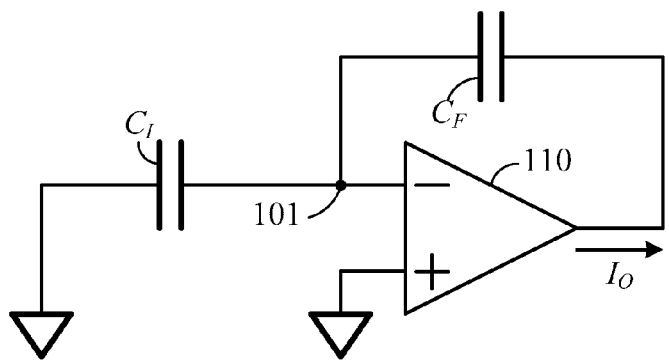
FIG. 1 shows a schematic diagram of a prior art charge transfer circuit.
Figure 2A:
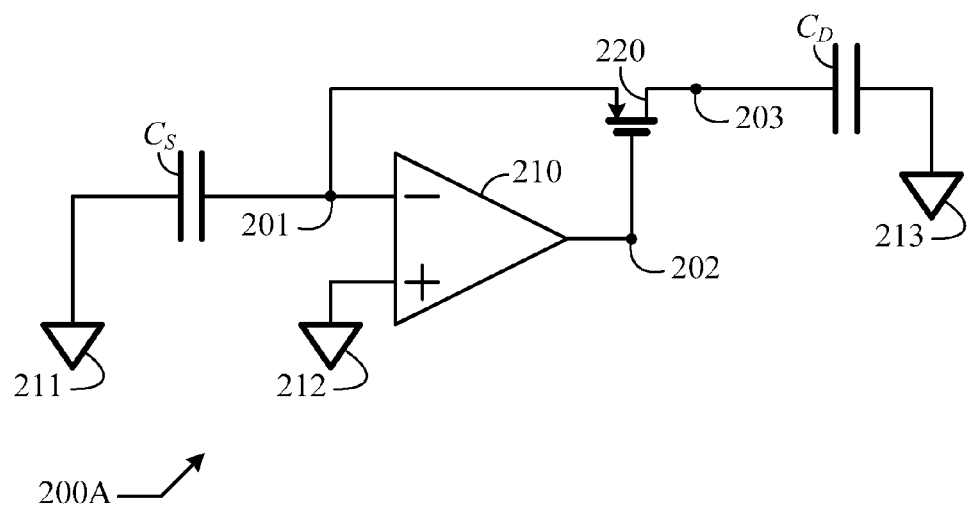
FIG. 2A shows a schematic diagram of a charge transfer circuit in accordance with an embodiment of the present invention.

FIG. 2A shows a schematic diagram of a charge transfer circuit 200A in accordance with an embodiment of the present invention. The charge transfer circuit 200A comprises: a source capacitor $C_S$, a destination capacitor $C_D$, a PMOS (p-channel metal oxide semiconductor) transistor 220, and an operational amplifier 210. Throughout this disclosure, a ground symbol (such as 211, 212, and 213) denotes a ground node, at which an electrical potential is substantially fixed. However, an electrical potential of a first ground node may not be necessarily equal to an electrical potential of a second ground node. For instance, the ground node 211 may not have the same electrical potential as the ground node 212. The operational amplifier 210 imposes a virtual ground condition on the circuit node 201 via the PMOS transistor 220, thus causing a charge stored on the source capacitor $C_S$ to transfer to the destination capacitor $C_D$. A major difference between the charge transfer circuit 200A of FIG. 2A and the prior art charge transfer circuit 100 of FIG. 1 is: the operational amplifier 110 imposes the virtual ground condition on the circuit node 101 by directly injecting current $I_O$ into the circuit node 101, while the operational amplifier 210 imposes the virtual ground condition on the circuit node 201 by providing a sufficiently low gate voltage for the PMOS transistor 220 (e.g., so that its source-to-gate voltage is greater than its threshold voltage) and letting the PMOS transistor 220 handle the charge transfer. For the charge transfer circuit 200A of FIG. 2A to have a fast charge transfer, the PMOS transistor 220 must have a sufficiently large width-to-length ratio and also must be quickly turned on upon a start of the charge transfer. In modern CMOS (complementary metal oxide semiconductor) technologies, a MOS (metal oxide semiconductor) transistor can have a very low threshold voltage (e.g., 300 mV) and also a very small length (e.g. 30 nm), and therefore can have a large width-to-length ratio without exhibiting a large gate capacitance, which is proportional to a product of the width and the length of the MOS transistor. As long as the PMOS transistor 220 has sufficiently large width-to-length ratio but does not have a large gate capacitance (seen at the circuit node 202), the operational amplifier 210 does not need to have a high driving capability but still can quickly drive the gate voltage of the PMOS transistor 220 sufficiently low to turn on the PMOS transistor 220 to enable fast charge transfer. The needed width-to-length ratio of the PMOS transistor 220 depends on the values of the source capacitor $C_S$ and the destination capacitor $C_D$. By way of example: $C_S$=800 fF, $C_D$=400 fF, the width/length of the PMOS transistor 220 is 16 μm/30 nm, and the gate capacitance of the PMOS transistor 220 is approximately 20 fF. Therefore, the operational amplifier 210 of FIG. 2A only needs to drive a 20 fF load. In contrast, if $C_I$=800 fF and $C_F$=400 fF, the operational amplifier 110 of FIG. 1 needs to drive a 266.7 fF load (i.e., 800 fF in series with 400 fF). The charge transfer circuit 200A of FIG. 2A, therefore, can have a superior power efficiency compared to the prior art charge transfer circuit 100 of FIG. 1, since the capacitive load for the operational amplifier is much smaller (more than ten times smaller in the above example). As noted above, the various values detailed above (e.g., threshold voltage, width, length, capacitance) are for illustrative purposes, and that other values may be used depending on the implementation. Details of FIG. 2A are self-explanatory (e.g., the source, the gate, and the drain terminals of the PMOS transistor 220 are connected to circuit nodes 201, 202, and 203, respectively) and apparent to those of ordinary skill in the art and thus not explained in detail here.

Figure 2B:
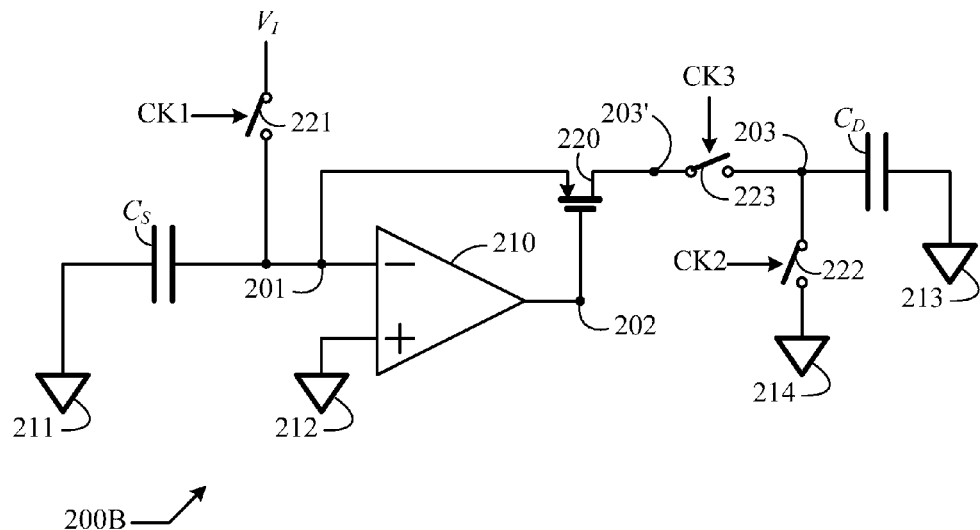
FIG. 2B shows a schematic diagram with more details of the charge transfer circuit of FIG. 2A that includes circuitry for enabling multiple-phase operation.

Note that what is shown in FIG. 2A is a simplified schematic diagram that does not show every detail of the charge transfer circuit 200A. In particular, a charge must be stored onto the source capacitor $C_S$ in the first place, before the charge can be transferred to the destination capacitor $C_D$. In practice, the charge transfer circuit 200A is a discrete-time circuit that has multiple phases including a sampling phase and a transfer phase, wherein: a charge is stored onto the source capacitor $C_S$ in the sampling phase, and the charge stored onto the source capacitor $C_S$ in the sampling phase is transferred to the destination capacitor $C_D$ in the transfer phase. In a multiple-phase discrete-time circuit, a plurality of switches controlled by a plurality of clock signals, respectively, are needed, wherein a state of said plurality of clock signals defines a phase of the multiple-phase discrete-time circuit. Since the present invention is primarily concerned with improving power efficiency of charge transfer in the transfer phase, FIG. 2A only shows a simplified, equivalent circuit of the charge transfer circuit 200A in the transfer phase, wherein: each switch (of said plurality of switches) that is turned on is equivalent to and thus replaced by a short circuit, each switch (of said plurality of switches) that is turned off is equivalent to and thus replaced by an open circuit, and as a result there are no switches explicitly shown in FIG. 2A. There are numerous workable embodiments for actual implementation of the charge transfer circuit 200A that can embody the multiple phase operation. FIG. 2B shows a schematic diagram of an exemplary charge transfer circuit 200B that is an embodiment of an actual implementation of the charge transfer circuit 200A of FIG. 2A that enables a multiple-phase operation. Besides what is shown in the charge transfer circuit 200A of FIG. 2A, the charge transfer circuit 200B of FIG. 2B further comprises a first switch 221, a second switch 222, and a third switch 223 controlled by a first clock signal CK1, a second clock signal CK2, and a third clock signal CK3, respectively. Besides, an additional ground node 214 is shown, and an internal circuit node 203' is labeled. The first clock signal CK1 and the third clock signal CK3 are non-overlapping; that is, they will not be asserted at the same time. The second clock signal CK2 and the third clock signal CK3 are also non-overlapping. The first clock signal CK1 and the second clock signal CK2, however, can be overlapping. When the first clock signal CK1 is asserted, the charge transfer circuit 200B is in the sampling phase, wherein an input voltage signal $V_I$ is stored onto the source capacitor $C_S$ via the first switch 221. When the second clock signal CK2 is asserted, the charge transfer circuit 200B is in a reset phase, wherein the circuit node 203 is shorted to the ground node 214 via the second switch 222 to reset a charge stored on the destination capacitor $C_D$. When the third clock signal CK3 is asserted, the charge transfer circuit 200B is in the transfer phase, wherein the first switch 221 and the second switch 222 are opened, the third switch 223 is closed, and the charge transfer circuit 200B of FIG. 2B is thus equivalent to the charge transfer circuit 200A of FIG. 2A, as mentioned earlier. FIG. 2B is self-explanatory and details (e.g., the source, the gate, and the drain terminals of the PMOS transistor 220 are connected to the circuit nodes 201, 202, and 203', respectively) are apparent to those of ordinary skill in the art and thus not explained in detail here.

Figure 2C:
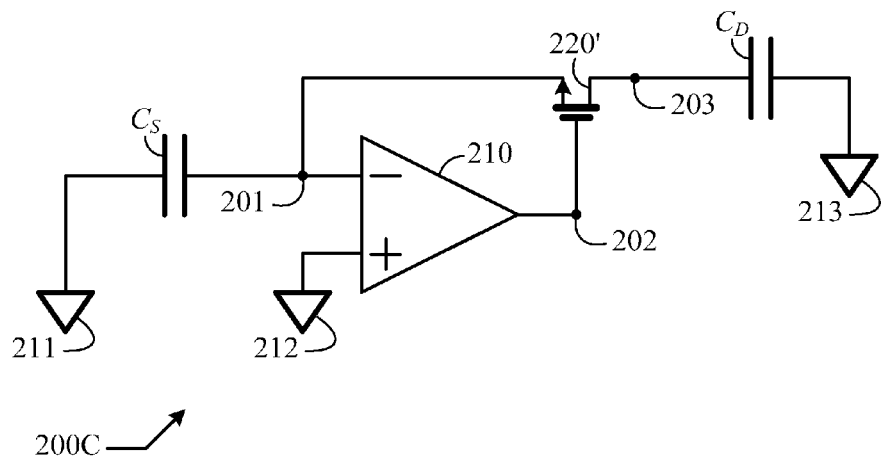
FIG. 2C shows a schematic diagram of a charge transfer circuit in accordance with an alternative embodiment of the present invention.

Now refer back to FIG. 2A. There is a restriction on the usage of the charge transfer circuit 200A of FIG. 2A. The PMOS transistor 220 must have a positive source-to-drain voltage, therefore the voltage at the circuit node 201 must be higher than the voltage at the circuit node 203. Circuit designers and/or users need to ensure that this condition holds throughout the charge transfer in an actual application, otherwise the charge transfer circuit 200A may not work properly. This condition can be ensured, for instance, if the input voltage $V_I$ is sufficiently high when the charge transfer circuit 200B of FIG. 2B is used for the actual implementation of the transfer circuit 200A of FIG. 2A. If the voltage at the circuit node 201 is too low for the charge transfer circuit 200A of FIG. 2A to be workable, an alternative charge transfer circuit 200C shown in FIG. 2C can be used. The charge transfer circuit 200C of FIG. 2C is the same as the charge transfer circuit 200A of FIG. 2A except that the PMOS transistor 220 in FIG. 2A is replaced by a NMOS (n-channel metal oxide semiconductor) transistor 220' in FIG. 2C. Due to using the NMOS transistor 220', the charge transfer circuit 200C can be workable when the voltage at the circuit node 201 is lower than the voltage at the circuit node 203. Those of ordinary skill in the art can add circuitry to the charge transfer circuit 200C of FIG. 2C so as to enable a multiple phase operation, in a similar way that circuitry is added to the charge transfer circuit 200A of FIG. 2A, resulting in the charge transfer circuit 200B of FIG. 2B that enables a multiple phase operation.

Figure 3:
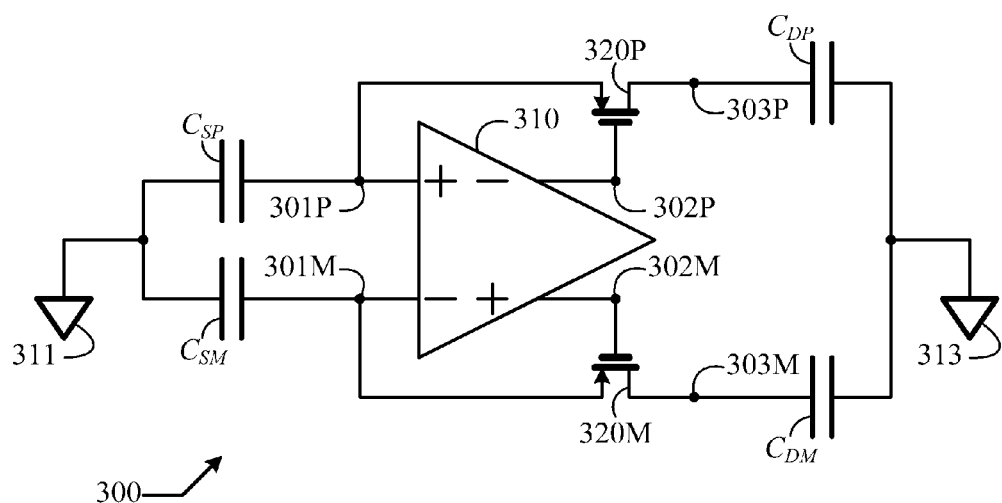
FIG. 3 shows a schematic diagram of a charge transfer circuit in a differential circuit topology in accordance with an embodiment of the present invention.

The charge transfer circuits 200A, 200B, and 200C shown in FIG. 2A, FIG. 2B, and FIG. 2C, respectively, are embodied in a single-ended circuit topology for purpose of simplicity and ease of illustration of a principle of the present invention. In practice, however, embodiments in form of differential circuit topology are often preferred due to better signal-to-noise ratio, as is understood and appreciated by those of ordinary skill in the art. FIG. 3 shows a charge transfer circuit 300 that embodies the charge transfer circuit 200A of FIG. 2A in a differential circuit topology. The following highlights differences between the charge transfer circuit 300 of FIG. 3 and the charge transfer circuit 200A of FIG. 2A: the ground node 211 in FIG. 2A is replaced by a ground node 311 in FIG. 3; the ground node 213 in FIG. 2A is replaced by a ground node 313 in FIG. 3; the circuit node 201 in FIG. 2A is replaced by two circuit nodes 301P and 301M in FIG. 3; the circuit node 202 in FIG. 2A is replaced by two circuit nodes 302P and 302M in FIG. 3; the circuit node 203 in FIG. 2A is replaced by two circuit nodes 303P and 303M in FIG. 3; the operational amplifier 210 in FIG. 2A is replaced by a differential operational amplifier 310 in FIG. 3; the source capacitor $C_S$ in FIG. 2A is replaced by two source capacitors $C_{SP}$ and $C_{SM}$ in FIG. 3; the destination capacitor $C_D$ in FIG. 2A is replaced by two destination capacitors $C_{DP}$ and $C_{DM}$ in FIG. 3; and the PMOS transistor 220 in FIG. 2A is replaced by two PMOS transistors 320P and 320M in FIG. 3. That the charge transfer circuit 300 of FIG. 3 is a differential circuit embodiment of the charge transfer circuit 200A of FIG. 2A is clear to those of ordinary skill in the art and thus not explained in detail here. The charge transfer circuit 200B of FIG. 2B and the charge transfer circuit 200C of FIG. 2C can be modified into a respective differential circuit embodiment in a similar manner that can be easily worked out by those of ordinary skill. Besides, those of ordinary skill in the art can add circuitry to the charge transfer circuit 300 of FIG. 3 so as to enable a multiple phase operation, in a similar way that circuitry is added to the charge transfer circuit 200A of FIG. 2A, resulting in the charge transfer circuit 200B of FIG. 2B that enables a multiple phase operation.

Figure 4:
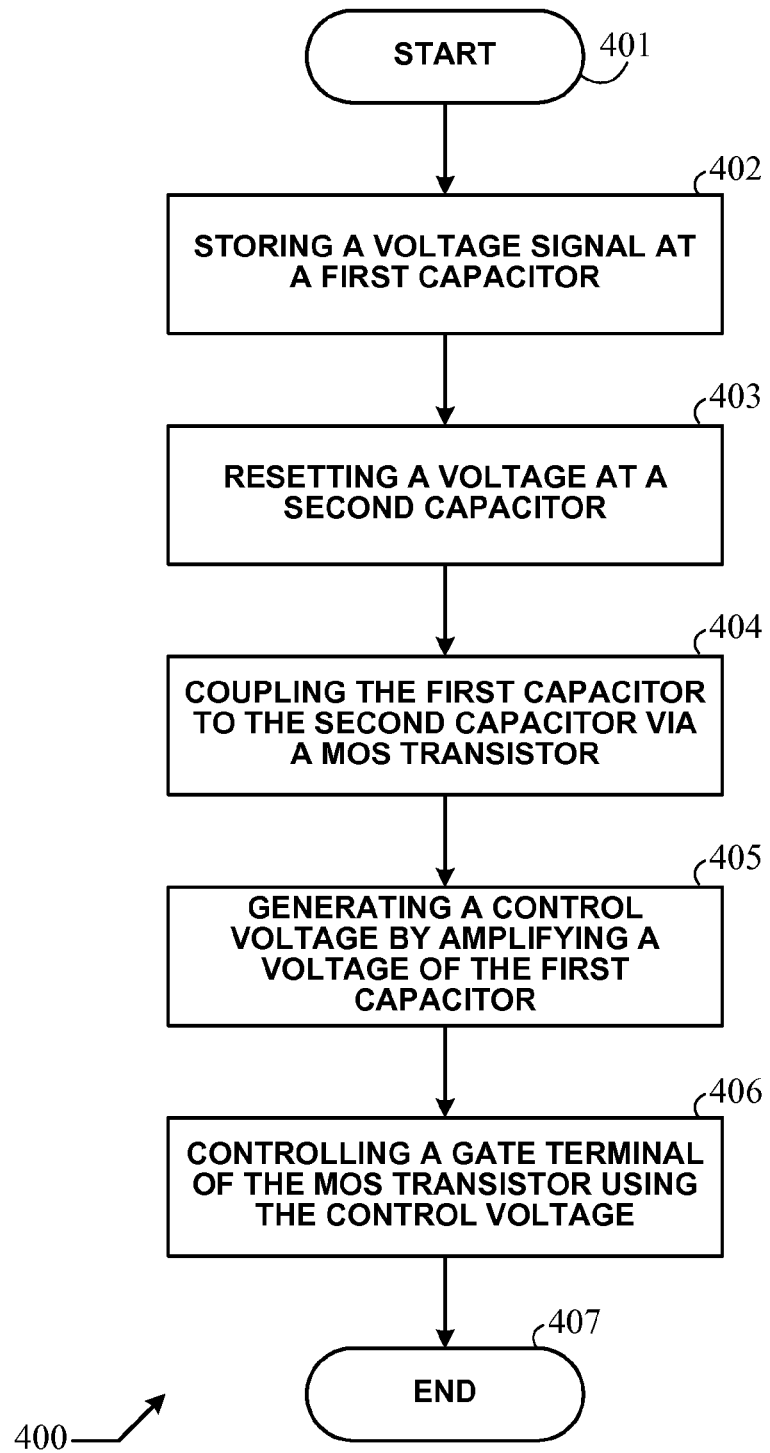
FIG. 4 shows a flow diagram of a method for charge transfer in accordance with an embodiment of the present invention.

FIG. 4 shows a flow diagram of a method 400 for charge transfer in accordance with an embodiment of the present invention. The method 400 comprises: upon start (step 401), storing a voltage at a first capacitor (step 402); resetting a voltage at a second capacitor (step 403); coupling the first capacitor to a second capacitor via a MOS transistor (step 404); generating a control voltage by amplifying a voltage of the first capacitor (step 405); and controlling a gate terminal of the MOS transistor using the control voltage (step 406); this concludes a charge transfer (step 407).

Those skilled in the art will readily observe that numerous modifications and alterations of the device and method may be made while retaining the teachings of the invention. For instance, the type of MOS transistors (e.g., p-type or n-type) depicted in FIGS. 2A-3 may be interchanged (e.g., to n-type or p-type, respectively) in some embodiments. Accordingly, the above disclosure should be construed as limited only by the metes and bounds of the appended claims.

What is claimed is:

1. A circuit comprising:
   a first capacitor;
   a second capacitor;
   a MOS (metal oxide semiconductor) transistor;
   an operational amplifier, wherein the first capacitor is configured to couple to the second capacitor via the MOS transistor; the operational amplifier is configured to receive a voltage at the first capacitor and output a control voltage; and the MOS transistor is configured to be controlled by the control voltage;
   a third capacitor;
   a fourth capacitor; and
   a second MOS (metal oxide semiconductor) transistor, wherein: the third capacitor is configured to couple to the fourth capacitor via the second MOS transistor; the operational amplifier is configured to receive a voltage at the third capacitor and output a second control voltage; and the second MOS transistor is configured to be controlled by the second control voltage.

2. The circuit of claim 1, wherein the MOS transistor is a PMOS transistor (p-channel metal oxide semiconductor).

3. The circuit of claim 1, wherein the MOS transistor is a NMOS transistor (n-channel metal oxide semiconductor).

4. The circuit of claim 1, wherein the operational amplifier comprises a differential amplifier.

5. A method comprising:
   storing a voltage at a first capacitor;
   resetting a voltage at a second capacitor;
   coupling the first capacitor to the second capacitor via a MOS (metal oxide semiconductor) transistor;
   generating a control voltage by amplifying a voltage of the first capacitor;

controlling a gate terminal of the MOS transistor using the control voltage;
storing a voltage at a third capacitor;
resetting a voltage at a fourth capacitor;
coupling the third capacitor to the fourth capacitor via a second MOS (metal oxide semiconductor) transistor;
generating a second control voltage by amplifying a voltage of the third capacitor; and
controlling a gate terminal of the second MOS transistor using the second control voltage.

6. The method of claim 5, wherein the MOS transistor is a PMOS (p-channel metal oxide semiconductor).

7. The method of claim 5, wherein the MOS transistor is a NMOS (n-channel metal oxide semiconductor).

8. The method of claim 5, wherein the storing comprises coupling the first capacitor to an input voltage via a switch controlled by a clock signal that is asserted during the storing.

9. The method of claim 5, wherein the resetting comprises coupling the second capacitor to ground node via a switch controlled by a clock signal that is asserted during the resetting.

10. The method of claim 5, wherein the coupling comprises coupling the first capacitor to the second capacitor via a serial connection of the MOS transistor and a switch controlled by a clock signal that is asserted during the coupling.

11. The method of claim 5, wherein the generating comprises using an operational amplifier.

* * * * *